(12) United States Patent
Sorgeloos et al.

(10) Patent No.: US 8,283,698 B2
(45) Date of Patent: Oct. 9, 2012

(54) ELECTROSTATIC DISCHARGE PROTECTION

(75) Inventors: Bart Sorgeloos, Gistel (BE); Benjamin Van Camp, Gistel (BE)

(73) Assignee: Sofics BVBA, Gistel (BE)

( * ) Notice: Subject to any disclaimer, the term of this patent is extended or adjusted under 35 U.S.C. 154(b) by 362 days.

(21) Appl. No.: 12/760,743

(22) Filed: Apr. 15, 2010

(65) Prior Publication Data

US 2010/0264457 A1 Oct. 21, 2010

Related U.S. Application Data

(60) Provisional application No. 61/169,544, filed on Apr. 15, 2009.

(51) Int. Cl.
*H01L 29/74* (2006.01)
(52) U.S. Cl. ............... 257/173; 257/355; 257/E27.11; 361/56; 361/91.1
(58) Field of Classification Search ............... 257/173, 257/355, E27.11; 361/56, 91.1
See application file for complete search history.

(56) References Cited

U.S. PATENT DOCUMENTS

| 6,768,616 | B2 | 7/2004 | Mergens et al. |
| 6,791,122 | B2 | 9/2004 | Avery et al. |
| 7,498,615 | B2 * | 3/2009 | Kuroda et al. ............... 257/173 |
| 7,746,610 | B2 * | 6/2010 | Choi ............................. 361/56 |
| 7,834,378 | B2 * | 11/2010 | Ryu et al. .................... 257/173 |

* cited by examiner

*Primary Examiner* — Minh-Loan T Tran
(74) *Attorney, Agent, or Firm* — Volpe and Koenig, P.C.

(57) ABSTRACT

An electrostatic discharge (ESD) protection circuit for protecting an integrated circuit (IC) having a first voltage potential, a first power supply potential and a second power supply potential. The ESD circuit includes a first NPN bipolar transistor having a first N-doped junction, a second N-doped junction and a third P-doped base junction. The first N-doped junction is coupled to the first voltage potential and the second N-doped junction is coupled to the first power supply potential. The ESD circuit also includes a first PNP bipolar transistor having a first P-doped junction, a second P-doped junction and a third N-doped base junction. The first P-doped junction is coupled to the first voltage potential and the second P-doped junction is coupled to the second power supply potential. The third P-doped base junction of the first NPN bipolar transistor is coupled to the third N-doped base junction of the first PNP bipolar transistor.

15 Claims, 5 Drawing Sheets

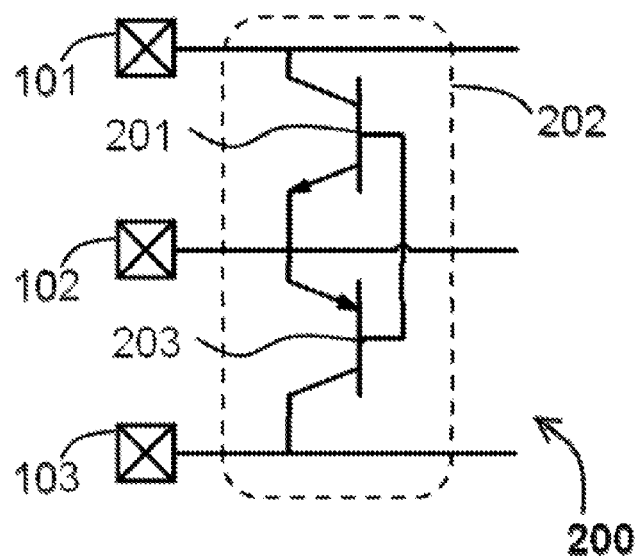
FIG. 2
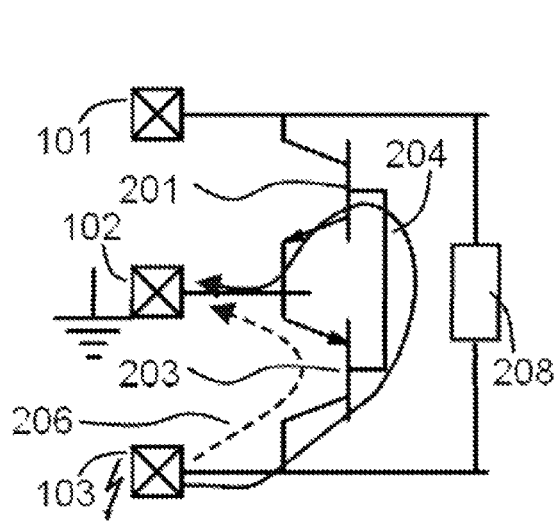 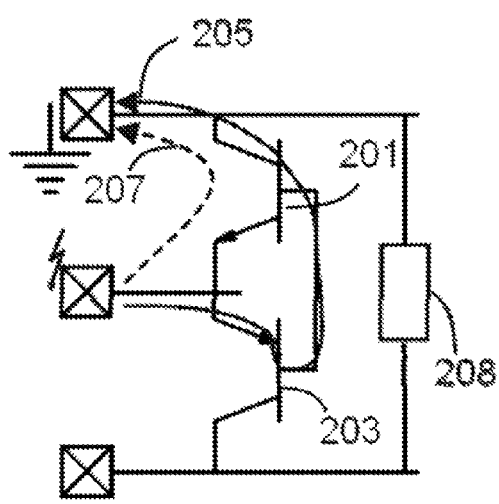
FIG. 2A      FIG. 2B

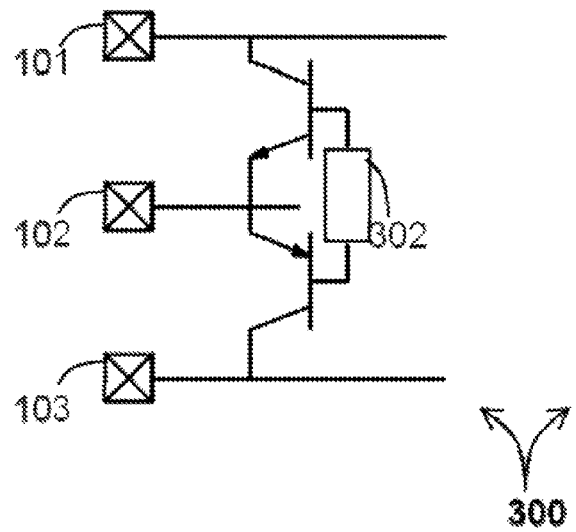
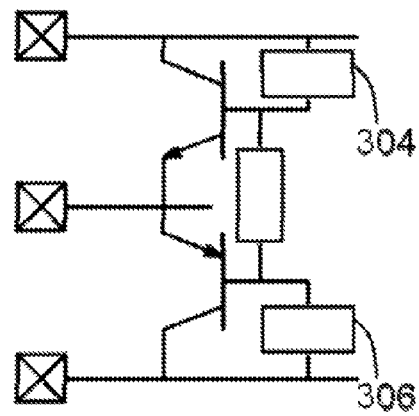
FIG. 3A  FIG. 3B
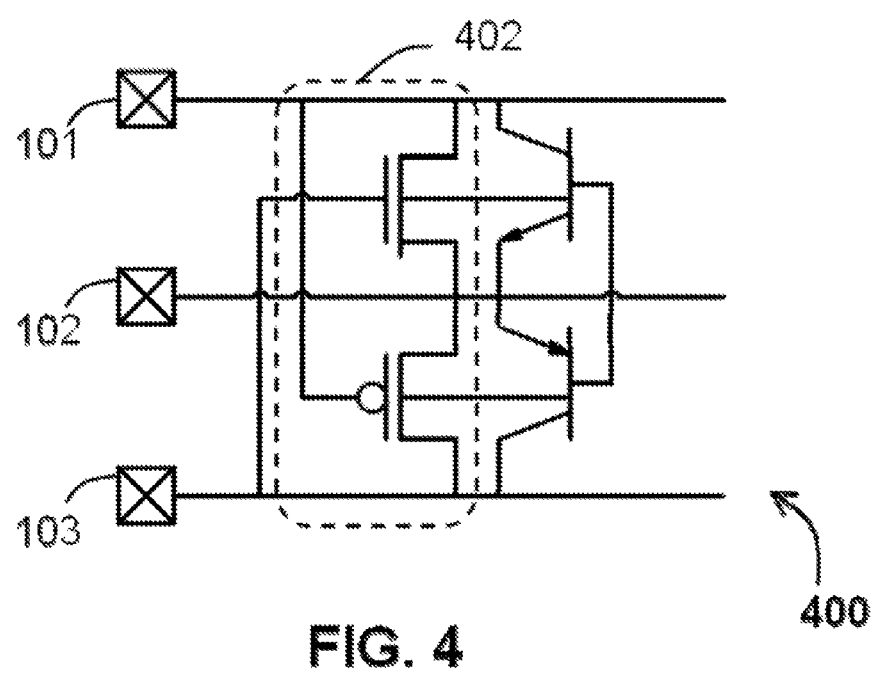
FIG. 4

ELECTROSTATIC DISCHARGE PROTECTION

CROSS REFERENCES

This patent application claims the benefit of U.S. Provisional Application Ser. No. 61/169,544 filed Apr. 15, 2009, the contents of which are incorporated by reference herein.

FIELD OF THE INVENTION

The present invention generally relates to circuits that provide improved electrostatic discharge (ESD) protection, and more particularly to an ESD protection circuit for providing an improved means for handling the maximum current during ESD operation.

BACKGROUND OF THE INVENTION

During ESD, large currents can flow through an Integrated Circuit (IC), potentially causing damage. To avoid this damage, protection circuits/elements are added. A lot of products require low capacitance at the input and high ESD performance. One of the lowest cap solutions for ESD protection is dual diode. This is the standard approach to protect an Input/Output (IO) circuitry. A typical protection circuit 100 uses a dual diode as a very classic ESD solution as shown in FIG. 1. The IO to be protected is connected to a first voltage potential, pad 102. Element 101 is a first power supply potential, an IC power supply (VDD) line and element 103 is a second power supply potential, ground (GND). A diode 104 is placed between the IO 102 and the VDD 101 to conduct current from the IO 102 to VDD 101 and a diode 105 is placed to conduct the current from the GND 103 to the IO 102. The diode 104 is normally a P+ junction connected to the IO 102 in an N-Well connected to the VDD 101. The diode 105 is normally an N+ junction connected to the IO 102 and the P-Well or P-substrate connected to GND 103.

For an ESD stress case from the IO 102 (positive zap) to the VDD 101 or from the IO 102 to the GND 103, all the current will flow through the diode 104 while there will be no current flowing through the diode 105. Similarly, in the case from stress from the GND 103 to the IO 102 or from the VDD 101 to the IO 102, all the current will flow through diode 105 while there will be no current flowing through the diode 105.

The maximum current that a diode can handle before failure is proportional with the area of the junction connected to pad. This area of the junction is the N+ junction in the case of diode 105 and P+ junction in the case of the diode 104. So each of these junctions must have a minimum area to handle the ESD current. Furthermore, the capacitance of the dual diode at the input is also proportional with the junction area. In this case the total capacitance seen at the IO pad 102 will be determined by the sum of the two junction areas of the diodes 104 and 105.

The disadvantage of utilizing a dual diode in a protection circuit is that all the current must flow though one junction. For example, for the stress case between the IO 102 and the VDD 101, the junction of the diode 105 does not provide any assistance in ESD protection, however, it does contribute to the total capacitance. Thus, there is a need in the art to be able to provide an ESD protection circuit such that the junction must be designed to handle all the current in the ESD protection circuit.

SUMMARY OF THE INVENTION

The present invention provides an electrostatic discharge (ESD) protection circuit for protecting an integrated circuit (IC). The ESD circuit includes a first voltage potential, a first power supply potential and a second power supply potential. The ESD circuit also includes at least a first NPN bipolar transistor having a first N-doped junction, a second N-doped junction and a third P-doped base junction. The first N-doped junction is coupled to the first voltage potential and the second N-doped junction is coupled to the first power supply potential. The ESD circuit further includes at least a first PNP bipolar transistor having a first P-doped junction, a second P-doped junction and a third N-doped base junction. The first P-doped junction is coupled to the first voltage potential and the second P-doped junction is coupled to the second power supply potential. The third P-doped base junction of the first NPN bipolar transistor is coupled to the third N-doped base junction of the first PNP bipolar transistor such that the first NPN bipolar transistor and the first PNP bipolar transistor conduct current in response to an ESD event.

BRIEF DESCRIPTION OF THE DRAWINGS

The present invention will be more readily understood from the detailed description of exemplary embodiments presented below considered in conjunction with the attached drawings, of which:

FIG. 2 depicts a schematic diagram of an improved ESD protection circuit in accordance with an embodiment of the present invention.

FIGS. 2A and 2B depict a schematic diagram of current flow in FIG. 2.

FIGS. 3A and 3B depict an improved ESD protection circuit in accordance with another embodiment of the present invention.

FIG. 4 depicts an improved ESD protection circuit in accordance with further embodiment of the present invention.

Figure 1:
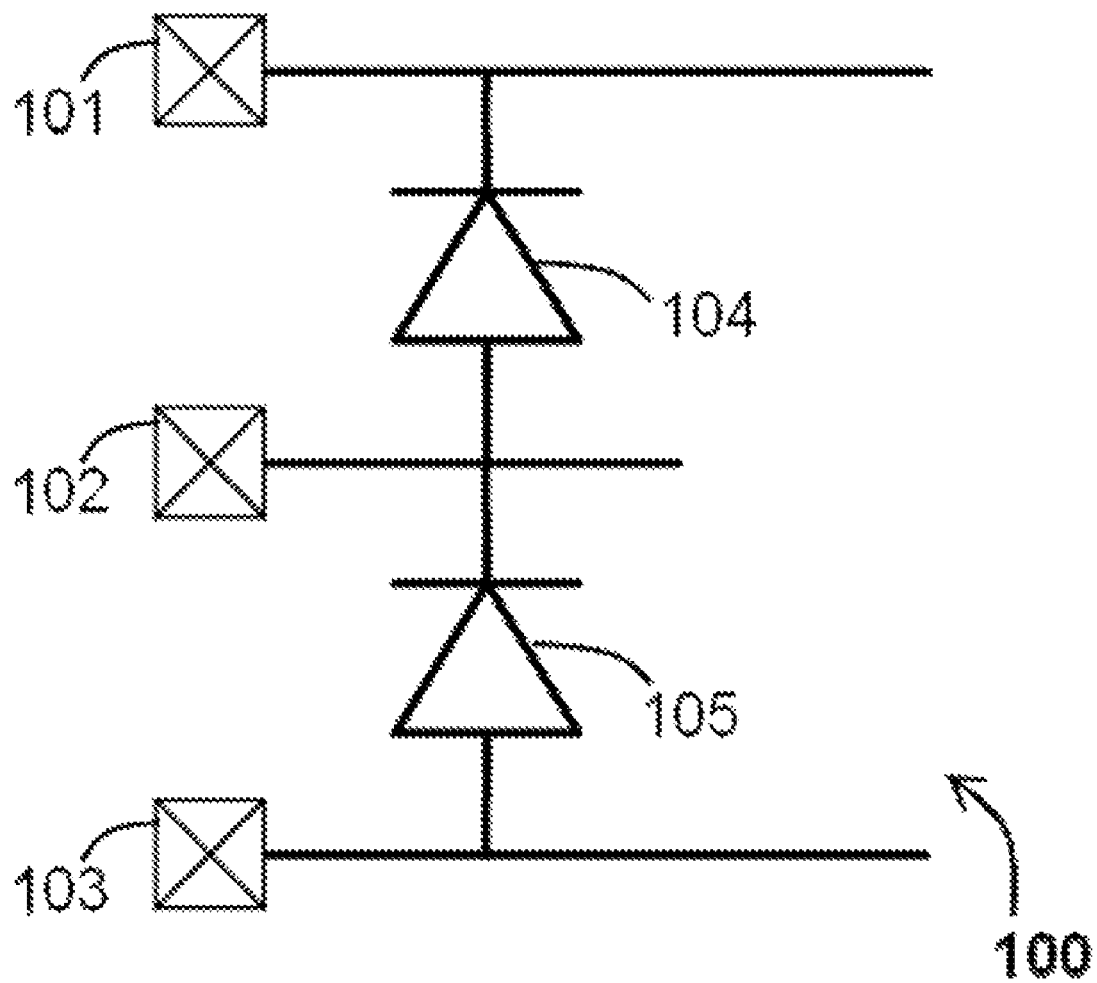
FIG. 1 depicts a schematic diagram of a prior art circuit of an ESD protection structure.

It is to be understood that the attached drawings are for purposes of illustrating the concepts of the invention.

DETAILED DESCRIPTION OF THE INVENTION

The present invention provides an ESD protection circuit having two base junctions combined to conduct maximum current during ESD stress.

Referring to FIG. 2, there is shown an ESD protection circuit 200 in accordance with one embodiment of the present invention. As shown in the circuit 200, a protection circuit 202 comprising bipolar transistors is added between the VDD line 101 and the GND line 103. Specifically, an NPN 201 of the protection circuit 202 is added between the IO 102 and the VDD line 101 and a PNP 203 of the protection circuit 202 is added between the IO 102 and the GND line 103. Furthermore as shown in FIG. 2, the base junction of the NPN 201 is connected to the base junction of the PNP 203. So, by combining the two junctions, the bipolar transistor 202 can function to conduct maximum current during ESD stress as will be described in greater detail with respect to FIGS. 2A and 2B below.

FIGS. 2A and 2B illustrate the current flow in FIG. 2 during an ESD event. A power clamp 208 parallel to the protection circuit 202 is coupled between the VDD line 101 and the GND line 103. This power clamp 208 will not be enabled during normal operation and will activate only during ESD operation FIG. 2A shows how the current will flow for stress from the GND 103 (negative ESD stress) to the IO 102 and FIG. 2B shows how the current will flow for stress (positive ESD stress) from the IO 102 to the VDD 101. For positive stress from the IO 102 to the GND 103, the current will follow the path from the IO 102 to the VDD 101 and through the power clamp 208 to the GND 103. Similarly for the positive stress from the VDD 101 to the IO 102, the current will first flow through the power clamp 108 and then follow the path from GND 103 to the IO 102.

As illustrated in FIG. 2A, initially current 204 will flow from the collector-base junction of the PNP 203 to the base-emitter of the NPN 201. This current path 204 is the series connection of two forwarded junctions which will conduct current if the voltage between the GND 103 and the IO 102 is two times the built-in voltage of a diode (around 0.7V-1V). So, there are two base junctions in series which will turn on the bottom PNP 203 causing another current 206 to flow through the collector-emitter of the PNP 203. As known with the operation of a bipolar transistor, the current 204 flowing through the collector-base junction of the PNP 203 will be multiplied with a certain factor, beta (multiplication factor), and this multiplied current will flow from the collector to the emitter of the PNP 203. Thus, from this moment onwards, both junctions, i.e. the emitter of NPN 201 and the emitter of PNP 203) are conducting current simultaneously from the GND 103 to the IO 102, one path current 204 conducts the base current and the other path 206 conducts beta times the base current.

Similarly operation can be defined for the ESD stress from the IO 102 to the VDD 101 such that there are two current paths. Initially, current 205 flows through the emitter-base of the PNP 203 to the base-collector of the NPN 201. So, there are two base junctions in series which will turn on the top NPN 201 causing another current 207 to flow through the emitter to collector of the NPN 201. So, there are two junctions at the IO 102, i.e. base-emitter of the PNP 203 and the collector-emitter of the NPN 201 conducting current simultaneously.

Thus, clearly by connecting the two junctions to an IO pad as illustrated in FIGS. 2A and 2B, the ESD current uses both junctions simultaneously for both current flow directions during ESD stress. Since the junction area of the junction connected to the IO is proportional to the current flowing through this junction and since the current will be lower (due to the second path—total current stays the same), the junctions area will be lowered. So, in an ideal case, the junction area (and the capacitance) can be reduced up to 50%. However, in a practical case the reduction will be between 0 and 50%. The actual performance depends on the beta of the bipolar transistors. If this beta value is 1, the reduction of the junction area will be 50%; otherwise, the area reduction will be smaller, however, the area reduction will still be much more than the prior art.

Referring to FIGS. 3A and 3B there is shown an ESD protection circuit 300 in accordance with another embodiment of the present invention. As shown in FIG. 3A, an additional circuit 302 can be connected between the bases of the two bipolar, NPN 203 and the PNP 201 of the circuit 200. Both the current flows as discussed above can be more controlled by increasing resistance (is equal by limiting current) or by introducing extra voltage drop. With these techniques the reduction of the area/capacitance can be optimized to reach the ideal beta of 50% as discussed above. If more base current 204 or 205 is flowing through the two bipolar than the current 206 or 207 through the collector/emitter, then adding circuit elements between the two bases will help to reduce this base current and to enhance the collector/emitter current, i.e. 206/207.

In one preferred embodiment, the additional circuits are diodes which built up an extra voltage drop (around 0.7V-1V built-in voltage+some extra voltage due to resistance of the diode) for each diode. The number of diodes depends on the technology. In another preferred embodiment, the additional circuit elements may preferably be a resistor or a MOS.

FIG. 3B shows two additional circuits 304 and 306 besides the circuit 302 in FIG. 3A. Circuit 304 is added between the base of the NPN 201 and the VDD 101 and circuit 306 is added between the base of the PNP 203 and the GND 103. Since the circuits 304 and 306 are placed in parallel with the base-collectors of the bipolar transistors, they would help to reduce the beta if the beta of the bipolar transistor 202 is larger than 1. For example for the stress case as described in FIG. 2A, the current through the collector-base junction of bipolar 203 was multiplied with a factor beta (this is the collector-emitter current). Since the circuit 306 is placed in parallel with the collector-base junction, it is noted that not all the current will flow through the collector base junction, and a part of the current will flow through the parallel path, i.e. through the circuit 306. This current will not be multiplied with a factor beta. Thus, the current flowing through the NPN 201 will be increased compared to the emitter current of the PNP 203. This can be further tuned so that the two currents are substantially equal, resulting in the optimal case. Circuits 304 and 306 may preferably comprise at least one of a diode, resistor, MOS, capacitor. Although three circuits are added as illustrated in FIG. 3B, one of ordinary skill will appreciate that only two circuits or even one circuit may suffice to help reduce the base current and enhance the collector/emitter current.

Referring to FIG. 4, there is illustrated an ESD protection circuit 400 in accordance with a further embodiment of the present invention. In this embodiment, instead of providing a separate bipolar transistor as described above (see FIG. 2), an inherent parasitic bipolar transistor of a MOS 402 is used. The current flow in FIG. 4 is similar to the current flow described above with respect to FIG. 2. Even though FIG. 4 illustrates parasitic bipolar of a transistor, one skilled in the art will appreciate that parasitic bipolar of other devices can be used.

Figure 5:
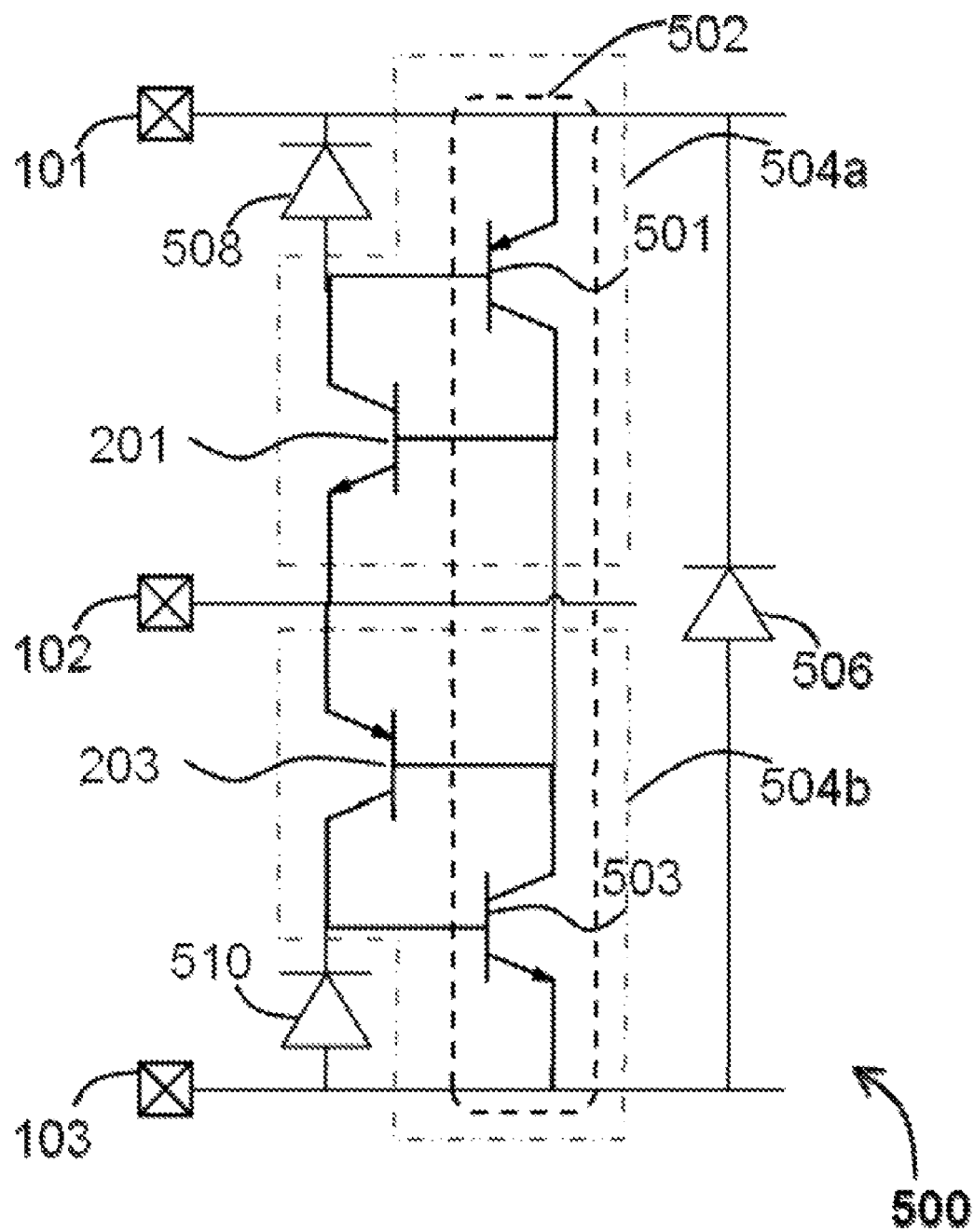
FIG. 5 depict an improved ESD protection circuit in accordance with even further embodiment of the present invention.

Referring to FIG. 5, there is shown an ESD protection circuit 500 in accordance with even further embodiment of the present invention. As illustrated in FIG. 5, an additional protection circuit 502 having a pnp 501 and npn 503 bipolar transistors are added which together with the bipolar transistor 202 forms a SCR 504. Specifically, the pnp 501 with the NPN 201 forms a first SCR 504a and the npn 503 with the PNP 203 forms a second SCR 504b. Also, diodes 506, 508 and, 510 are added to allow the current flows as will be described in greater detail below.

Figure 5A:
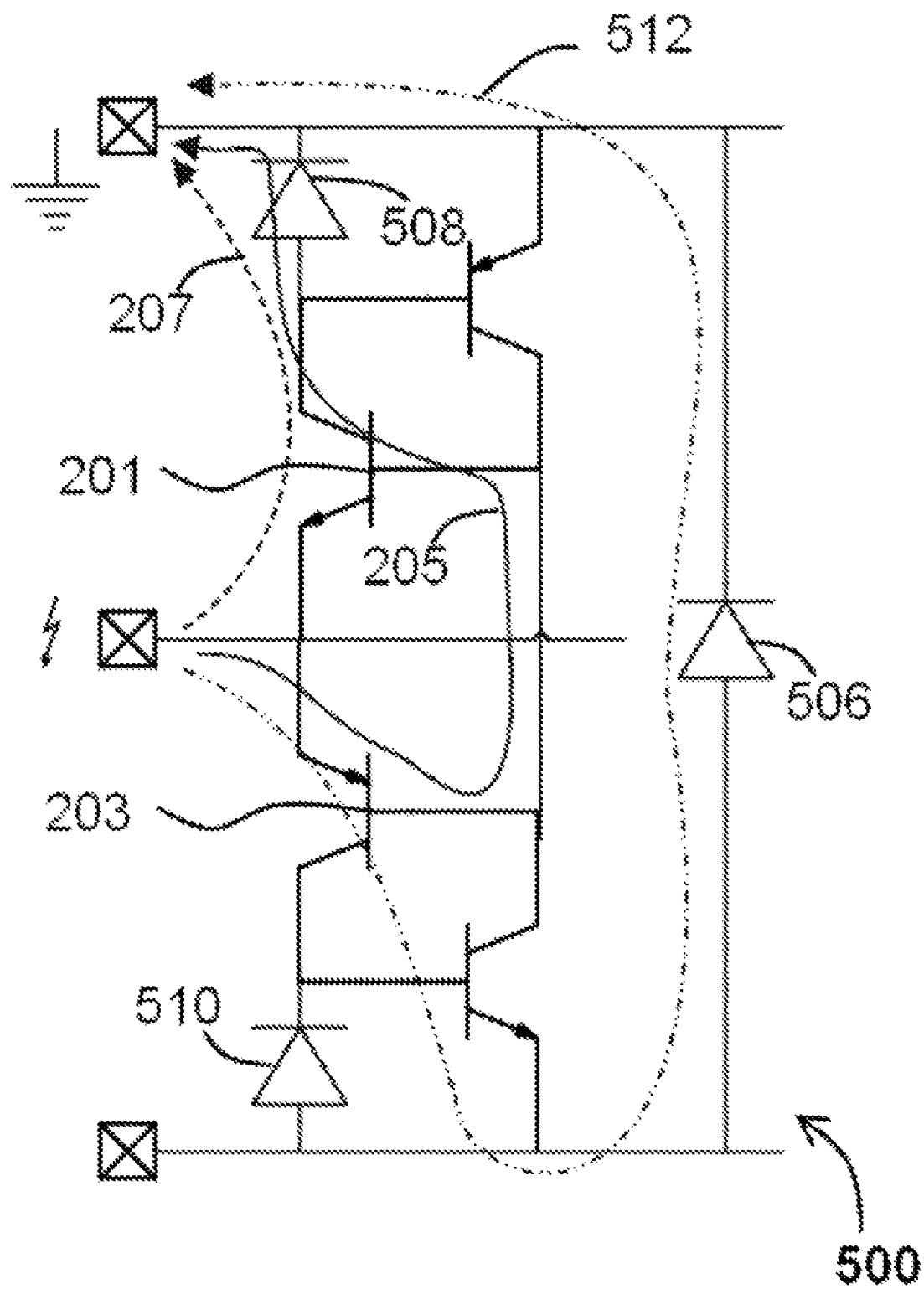
FIG. 5A depicts a schematic diagram of a current flow in FIG. 5.

FIG. 5A illustrate the current flow in FIG. 5 during an ESD event from the IO 102 to the VDD 101. This is similar to the embodiment described in FIG. 2B above. Initially the current 205 will flow through the emitter-base junction of the PNP 203, the base-collector junction of the NPN 201 and also through the diode 508. Similar as in the previous embodiment of FIG. 2B, if the current 205 is flowing through the base of a bipolar transistor, current 207 will also flow from the collector to the emitter of the bipolar transistor (multiplied with beta). However, in this case the current 205 turns on the PNP 203, which creates an additional current 512 to flow to the collector of the PNP 203. This current 512 will flow into the base of the npn 503 of the bipolar transistor 502 and since, the two bipolar transistors 202 and 502 form the SCR 504, this additional current 512 will turn on the SCR 504 and provide a third path for the ESD current. The diode 506 is placed in the chip to provide a path for the current 512 to flow from GND 103 to the power supply 101. This diode 506 can be placed in the circuit as a separate clamp, or it can be the parasitic diode that is inherent present between GND and VDD in each chip.

It is noted that a direct connection between the collector of the NPN 201 and the VDD 101 will cause a short to the base-emitter of the NPN 201. So, a diode 508 is placed between the collector of the NPN 201 and the VDD 101. Similarly, the direct connection between the PNP 201 and the GND 103 will cause a short to the base-emitter of the PNP 203, thus a diode 510 is placed between the collector of the PNP 203 and the GND 103. So, these diodes 508 and 510 are placed to prevent the direct connections of the junctions to the VDD 101 and the GND 103 respectively and thus to ensure that the PNP 203 or NPN 201 can turn on during ESD. Alternatively, diodes 508 and 510 may preferably be replaced by transistors or resistors.

It is noted that depending on the current flow, the emitter and the collector of the bipolar transistor 202 as illustrated in the figures of the present invention may preferably be switched. For simplicity in the figures the arrow to indicate the emitter and collector are taken always at the same position. Also, even though not shown, additional trigger elements may preferably be added to the circuits of the present invention to enhance the triggering of the SCRs, as described in U.S. Pat. Nos. 6,768,616 and 6,791,122

Although various embodiments that incorporate the teachings of the present invention have been shown and described in detail herein, those skilled in the art can readily devise many other varied embodiments that still incorporate these teachings without departing from the spirit and the scope of the invention.

The invention claimed is:

1. An electrostatic discharge (ESD) protection circuit for protecting an integrated circuit (IC) comprising:
    a first voltage potential, a first power supply potential and a second power supply potential;
    at least a first NPN bipolar transistor including a first N-doped junction, a second N-doped junction and a third P-doped base junction, wherein the first N-doped junction is coupled to the first voltage potential and the second N-doped junction is coupled to the first power supply potential; and
    at least a first PNP bipolar transistor including a first P-doped junction, a second P-doped junction and a third N-doped base junction, wherein the first P-doped junction is coupled to the first voltage potential and the second P-doped junction is coupled to the second power supply potential, said third P-doped base junction of the first NPN bipolar transistor is coupled to said third N-doped base junction of the first PNP bipolar transistor, whereby the first NPN bipolar transistor and the first PNP bipolar transistor conduct current in response to an ESD event.

2. The ESD circuit of claim 1 further comprising a first circuit element coupled between the third P-doped base junction of the first NPN bipolar transistor and the third N-doped base junction of the first PNP bipolar transistor, wherein said first circuit element comprise at least one of a diode, MOS and a resistor.

3. The ESD circuit of claim 1 further comprising a second circuit element coupled between the third P-doped base junction of the first NPN bipolar transistor and the first power supply potential, wherein said second circuit element comprise at least one of a diode, MOS and a resistor.

4. The ESD circuit of claim 1 further comprising a third circuit element coupled between the third N-doped base junction of the first PNP bipolar transistor and the second power supply potential, wherein said third circuit element comprise at least one of a diode, MOS and a resistor.

5. The ESD circuit of claim 1 wherein said at least one of the first PNP bipolar transistor and the first NPN bipolar transistor is a parasitic bipolar transistor.

6. The ESD circuit of claim 1 further comprising a second NPN bipolar transistor including a first N-doped junction, a second N-doped junction and a third P-doped base junction, wherein the first N-doped junction is coupled to the third N-doped base junction of the first PNP bipolar transistor, wherein the second N-doped junction is coupled to the second power supply potential, and the third P-doped base is coupled to the second P-doped junction of the first PNP bipolar transistor.

7. The ESD circuit of claim 6 further comprising a second PNP bipolar transistor including a first P-doped junction, a second P-doped junction and a third N-doped base junction, wherein the first P-doped junction is coupled to the third P-doped base junction of the first NPN bipolar transistor, the second P-doped junction is coupled to the first power supply potential, and the third N-doped base is coupled to the second N-doped junction of the first NPN bipolar transistor 8. The ESD circuit of claim 7 wherein said first PNP bipolar transistor and said second NPN bipolar transistor form a first SCR and wherein said first NPN bipolar transistor and said second PNP bipolar transistor form a second SCR.

9. The ESD circuit of claim 8 further comprising a first circuit coupled between the second N-doped junction of the first NPN bipolar transistor and the first power supply potential.

10. The ESD circuit of claim 9 wherein said first circuit comprise at least one element of a diode, resistor and transistor.

11. The ESD circuit of claim 8 further comprising a second circuit coupled between the second P-doped junction of the first PNP bipolar transistor and the second power supply potential.

12. The ESD circuit of claim 11 wherein said second circuit comprise at least one element of a diode, resistor and transistor.

13. The ESD circuit of claim 8 further comprising a third circuit coupled between the first power supply potential and the second power supply potential.

14. The ESD circuit of claim 13 wherein said third circuit comprise at least one element of a diode, resistor and transistor.

15. The ESD circuit of claim 1 wherein said first power supply potential comprise the IC power supply, said second power supply potential comprise a ground and said first voltage potential comprise a pad.

* * * * *